(12) United States Patent
Dulcey

(10) Patent No.: US 11,544,163 B2
(45) Date of Patent: Jan. 3, 2023

(54) METHOD, A DIAGNOSING SYSTEM AND A COMPUTER PROGRAM PRODUCT FOR DIAGNOSING A FIELDBUS TYPE NETWORK

(71) Applicant: Procentec B.V., Rotterdam (NL)

(72) Inventor: Matthew Dulcey, Rotterdam (NL)

(73) Assignee: Procentec B.V., Rotterdam (NL)

( * ) Notice: Subject to any disclaimer, the term of this patent is extended or adjusted under 35 U.S.C. 154(b) by 66 days.

(21) Appl. No.: 16/932,409

(22) Filed: Jul. 17, 2020

(65) Prior Publication Data

US 2021/0019242 A1 Jan. 21, 2021

(30) Foreign Application Priority Data

Jul. 17, 2019 (NL) .................................... 2023521

(51) Int. Cl.
*G06F 11/00* (2006.01)
*G06F 11/22* (2006.01)
(Continued)

(52) U.S. Cl.
CPC .......... *G06F 11/221* (2013.01); *G01R 13/029* (2013.01); *G06F 11/2263* (2013.01);
(Continued)

(58) Field of Classification Search
CPC . G06F 11/221; G06F 11/2263; G01R 13/029; G01R 31/001; G01R 31/52;
(Continued)

(56) References Cited

U.S. PATENT DOCUMENTS 7,630,861 B2 * 12/2009 Longsdorf ............. G01F 15/00
702/65
7,899,638 B2 3/2011 Miller
(Continued)

FOREIGN PATENT DOCUMENTS

WO 2015103469 A1 7/2015
WO 2018104929 A1 6/2018

OTHER PUBLICATIONS

Machado, et al. "A Neural Network MultiAgent Architecture Applied to Fieldbus Intelligent Control", Emerging Technologies and Factory Automation, 2008, IEEE International Conference on, IEEE, Piscataway, NJ, Sep. 15, 2008, pp. 567-574.
(Continued)

*Primary Examiner* — Sarai E Butler
(74) *Attorney, Agent, or Firm* — BakerHostetler

(57) ABSTRACT

The invention relates to a method for diagnosing a fieldbus type network. The method comprises the steps of measuring, using a signal measuring device such as an oscilloscope, a bus signal of the fieldbus type network, providing the measured bus signal to a computer system, and generating, by the computer system, a diagnosis. The diagnosis is performed by executing a step of comparing, by the computer system, the measured bus signal with signals in a database of bus signals and corresponding diagnoses; and/or feeding, by the computer system, the measured bus signal to a trained statistical model trained to diagnose the fieldbus type network; as well as a step of outputting the diagnosis based on the output of the comparison and/or the output of the statistical model.

15 Claims, 4 Drawing Sheets

(51) Int. Cl.
| | |
|---|---|
| *G06F 16/23* | (2019.01) |
| *G06N 20/00* | (2019.01) |
| *G01R 13/02* | (2006.01) |
| *G06F 13/42* | (2006.01) |
| *G06N 5/04* | (2006.01) |
| *G01R 31/52* | (2020.01) |
| *G01R 31/00* | (2006.01) |

(52) U.S. Cl.
CPC ...... *G06F 13/4282* (2013.01); *G06F 16/2379* (2019.01); *G06N 5/04* (2013.01); *G06N 20/00* (2019.01); *G01R 31/001* (2013.01); *G01R 31/52* (2020.01)

(58) Field of Classification Search
CPC .......... G06N 5/04; G06N 20/00; H04L 12/40; H04L 41/142; H04L 41/16
USPC ...................................................... 714/1–57
See application file for complete search history.

(56) References Cited

U.S. PATENT DOCUMENTS

| | | | |
|---|---|---|---|
| 8,122,161 B2* | 2/2012 | Tegnell | H04L 12/40032 710/15 |
| 9,541,579 B2 | 1/2017 | Letts | |
| 10,014,978 B2 | 7/2018 | Horn et al. | |
| 2002/0169582 A1 | 11/2002 | Eryurek et al. | |
| 2002/0194547 A1* | 12/2002 | Christensen | H04L 12/423 714/E11.026 |
| 2004/0133289 A1* | 7/2004 | Larsson | G05B 23/0248 700/83 |
| 2007/0233858 A1* | 10/2007 | Goff | H04L 43/0811 709/224 |
| 2009/0138104 A1* | 5/2009 | Huck | H04L 29/12801 700/75 |
| 2009/0265583 A1* | 10/2009 | Bouse | G05B 19/0425 714/37 |
| 2011/0145180 A1* | 6/2011 | Muller | G05B 19/042 706/23 |
| 2011/0264396 A1 | 10/2011 | Kitchener et al. | |
| 2013/0346783 A1* | 12/2013 | Weber | G06F 11/3058 713/340 |
| 2015/0061662 A1* | 3/2015 | Ausserlechner | G01R 33/091 324/252 |
| 2016/0328351 A1* | 11/2016 | Vogt | G05B 19/4185 |
| 2018/0024538 A1* | 1/2018 | Benson | G05B 19/4186 340/539.11 |
| 2018/0285303 A1* | 10/2018 | Esposito | G06F 13/4086 |

OTHER PUBLICATIONS

Wegener et al., "Development of a Low Cost Embedded Diagnosis System for Servo Controlled Drives Including Data Mining Technologies", Industrial Electronics, 2009, ISIE 2009, IEEE International Symposium on, IEEE, Piscataway, NJ, Jul. 5, 2009, pp. 373-377.

Tektronix, "How to Troubleshoot System Problems Using an Oscilloscope with I2C and SPI Decoding", Equipements Scientifiqus SA (ES), Mar. 2017, 16 pages.

Sotting Industrial Automation GmbH, "The New PROFIBUS Tester 5, The Easy Approach Beginners and Professionals", Copyright 2015, 57 pages.

\* cited by examiner

METHOD, A DIAGNOSING SYSTEM AND A COMPUTER PROGRAM PRODUCT FOR DIAGNOSING A FIELDBUS TYPE NETWORK

CROSS-REFERENCE TO RELATED APPLICATIONS

This application claims priority to Dutch Patent Application No. NL 2023521, filed Jul. 17, 2019, the disclosure of which is hereby incorporated by reference as if set forth in its entirety herein.

The invention relates to a method for diagnosing a fieldbus type network, in particular a computer-implemented method for diagnosing a fieldbus type network.

A fieldbus type network system is frequently used for control of various devices. For example, fieldbus type network systems can be used to connect various instruments and/or machines within a production facility, like a car factory, at a research lab, and the like. Examples of fieldbus standards include PROFIBUS, CAN, and I2C. Generally, a fieldbus type network may be implemented as an RS-485 type network or another field bus type network having communication signals and power signals. Sometimes these fieldbus networks suffer from a technical malfunction, which can lead to considerable downtime of a facility, and thus to a possible large financial loss. In order to solve such a technical malfunction the fieldbus network can be diagnosed. In particular, it may be diagnosed whether the disturbance is caused by a too long cable, and extra termination, an issue with electromagnetic compatibility, a missing termination, a short circuit with a shield. The diagnosis is based on visual inspection of an oscilloscope image by an individual trained in relating the oscilloscope image to a particular cause. However, this approach has several disadvantages. For example, the diagnosis is subjective as it is dependent on the experience of this particular individual. Moreover, this current method is also labor-intensive and expensive.

An object of the invention is to overcome at least some of the above disadvantages associated with diagnosis of a fieldbus network.

Thereto, the invention provides a method for diagnosing a fieldbus type network comprising: measuring, using a signal measuring device such as an oscilloscope, a bus signal of the fieldbus type network; providing the measured bus signal to a computer system; generating, by the computer system, a diagnosis by performing the following steps: comparing, by the computer system, the measured bus signal with signals in a database of bus signals and corresponding diagnoses, and/or feeding, by the computer system, the measured bus signal to a trained statistical model trained to diagnose the fieldbus type network; and outputting the diagnosis based on the output of the comparison and/or the output of the statistical model.

By providing a method for diagnosing a fieldbus type network that employs a computer system for providing a diagnosis, one can obtain a more reliable and also a more efficient diagnosis of a fieldbus type network. In particular, the above method obviates the need for hiring personnel that has been trained for years in relating a particular disturbance of the signal to a corresponding cause in the network, thereby saving costs. Furthermore, by employing such a method one can guarantee a more objective diagnosis.

Preferably, the method may further comprises generating, by the computer system, based on the diagnosis, a diagnosis file; wherein the diagnosis file characterizes whether the signal of the fieldbus type network is affected by a disturbance of the fieldbus type network; and the diagnosis file further comprises a most likely cause of the disturbance, if the signal of the fieldbus type network is affected by the disturbance of the fieldbus type network. The most likely cause of the disturbance may for example be a too long cable, an extra termination, electromagnetic compatibility (EMC), a missing termination, a short circuit with a shield, an unpowered termination or another cause.

Additionally and/or alternatively, the diagnosis file may comprise a confidence level for each member of a group of possible causes, that may have caused the disturbance of the fieldbus network, thereby obtaining an advantage that if the network is not functioning properly one can prioritize which causes should first be considered.

According to another aspect of the invention, a diagnosing system is provided comprising a signal measuring device such as an oscilloscope, and a computer system, wherein the signal measuring device is arranged for: measuring a bus signal of the fieldbus type network; and sending the measured bus signal to the computer system; wherein the computer system is arranged for: receiving the measured bus signal from the signal measuring device; and generating a diagnosis by performing the following steps: comparing the measured bus signal with signals in a database of bus signals and corresponding diagnoses, and/or feeding the measured bus signal to a trained statistical model trained to diagnose the fieldbus type network; and outputting the diagnosis based on the output of the comparison and/or the output of the statistical model.

Further, the invention relates to a computer program product for diagnosing a fieldbus network. A computer program product may comprise a set of computer executable instructions stored on a data carrier, such as but not limited to a flash memory, a CD or a DVD. The set of computer executable instructions, which allow a programmable computer to carry out the method as defined above, may also be available for downloading from a remote server, for example via the Internet, e.g. as an app.

The computer program product comprises computer readable code for causing a processor to perform the steps of: receiving a measured bus signal that has been measured on a fieldbus type network by a signal measuring device such as an oscilloscope; and generating a diagnosis by performing the following steps: comparing the measured bus signal with signals in a database of bus signals and corresponding diagnoses, or feeding the measured bus signal to a trained statistical model trained to diagnose the fieldbus type network; and outputting the diagnosis based on the output of the comparison or the output of the statistical model.

Other advantageous embodiments according to the inventions are described in the following claims.

In the figures identical or corresponding parts are represented with the same reference numerals. The drawings are only schematic representations of embodiments of the invention, which are given by manner of non-limited examples.

Figure 1:
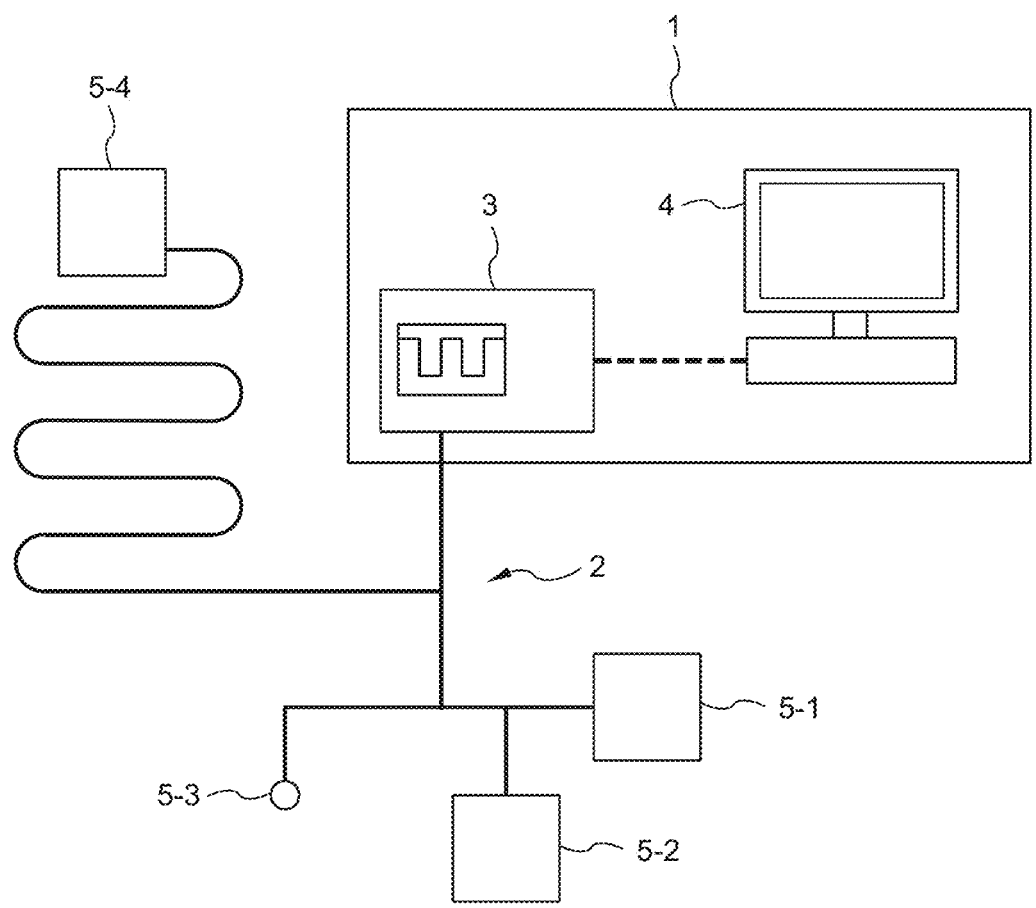
FIG. 1 shows a schematic view of a diagnosing system according to the invention.

FIG. 1 shows a schematic view of a diagnosing system 1 according to the invention. The system 1 is arranged for diagnosing a fieldbus type network 2, also shown, for example employing an industry protocol like the PROFI-BUS standard for fieldbus communication. As another example, the network 2 may use I2C (Inter-Integrated Circuit). Generally, the fieldbus type network may be implemented as an RS-485 type network or another field bus type network having communication signals and power signals. The diagnosing system includes a signal measuring device such as an oscilloscope 3, which can measure signals, e.g. voltages, of the fieldbus type network as a function of time. Such an oscilloscope 3 may also be equipped with processor and a memory for storing a portion of the measured signal. For example, such a signal may be stored as a JSON file, however, other file formats are also possible. The oscilloscope 3 is connected to the fieldbus type network 2 for measuring bus signals thereon. The system 1 also includes a computer system 4, which is communicatively coupled to the oscilloscope 3, e.g. by means of a wired or wireless connection. Said computer system 4 may be used in analyzing signals measured by the oscilloscope 3, and/or can be used to control the oscilloscope 3.

In FIG. 1, the fieldbus type network 2 is connected to two devices 5-1 and 5-2. Further, the fieldbus type network 2 includes a terminal 5-3 that is not connected to another device, as well as a cable 5-4 that is too long.

Typically, a fieldbus type network may require square waves to enable communication between devices connected to the network. However, several factors may disturb the square-like nature of the fieldbus signals, thereby leading to errors. These factors may, for example include, too long cables 5-4, short circuits, or a missing termination 5-3, etc. In order to diagnose the fieldbus network 2 an input signal may be fed to the fieldbus network 2. Subsequently, the oscilloscope 3 measures a responsive bus signal of the fieldbus network 2, also referred to as response signal. The measured response signal can be provided to the computer system 4, which can then generate a diagnosis. The computer system 4 can generate a diagnosis by performing the following steps: comparing the measured bus signal with signals in a database of bus signals and corresponding diagnoses, and/or feeding the measured bus signal to a trained statistical model trained to diagnose the fieldbus type network; and outputting the diagnosis based on the output of the comparison and/or the output of the statistical model. Typically, the statistical model performs a statistical classification, for example based on logistic regression, linear discriminant analysis, support vector machines, neural networks, etc. The step of comparing may invoke various mathematical techniques. The database of bus signals and corresponding diagnoses comprises signals that are acceptable and signals that are unacceptable, wherein unacceptable means that there is a disturbance.

Typically, the output diagnosis includes identification of a fault such as a disturbance of the fieldbus type network 2.

In an embodiment, the diagnoses of the bus signals in the database have been provided by experienced individuals. It is noted that the database of bus signals and corresponding diagnoses may, in principle, also be generated by simulating a fieldbus type network.

In an advantageous embodiment, it is verified whether the diagnosis is correct. For example, one may shorten the cable in case the diagnosis was a too long cable 5-4. If this then solves the disturbance it is verified that the diagnosis is correct. In case of a correct diagnosis, the diagnosis and measured bus signal may be added to the database of earlier measured bus signals and corresponding diagnoses; or the trained statistical model may be updated using the diagnosis and measured bus signal.

It is noted that the measured bus signal on the oscilloscope 3 can be directly sent to the computer system 4, however, the oscilloscope may also first store a portion of the measured bus signal.

Furthermore, the computer system 4 may be located within the same facility as the fieldbus network 2, but may also be located at a remote location, e.g. having Internet connectivity or connectivity to a local or global communications network. Further, the computer system 4 can be implemented as a server, e.g. remotely located, e.g. in the cloud. Alternatively, the computer system 4 can be implemented as a handheld electronic device such as a tablet or smartphone.

The statistical model used by the computer system 4 in generating the diagnosis may be trained on a database that links oscilloscope images (or a digital file representative for the oscilloscope image) to a cause of a disturbance. In particular, such a database may be constructed by a service engineer, that is trained in relating deviations of the square-like waves to errors in the fieldbus network. Possible sources of disturbances or deviations includes too long cables 5-4, a missing termination 5-3, a short circuit with the shield, an unpowered termination, EMC, etc. These different error sources lead to distinct characteristics in the measured response signal 10 such that signal deviations are linked, somehow, to a specific physical cause or causes. Put differently, a deviation from the standard square-wave form signals a physical problem in the network wiring, and each wiring issue results in different deviation patterns from a standard square wave.

In addition to the measured response signal 10, the computer system may base its diagnosis on other parameters, characterizing the network, including its network speed, the number of connected devices, voltage, etc.

Preferably, the computer system 4 generates, based on the diagnosis, a diagnosis file 6, wherein the diagnosis file 6 characterizes whether the signal of the fieldbus type network 2 is affected by a disturbance of the fieldbus type network 2. The diagnosis file 6 may comprise a most likely cause 9 of the disturbance, if the signal of the fieldbus type network is affected by the disturbance of the fieldbus type network 2. The most likely cause 9 may, for example, be a too long cable, an extra termination, electromagnetic compatibility (EMC), a missing termination, a short circuit with a shield, an unpowered termination, or another cause.

In a preferred embodiment, the diagnosis file 6 generated by the computer further comprises a confidence level for each member of a group of possible causes 8, that may have caused the disturbance of the fieldbus network. Such a confidence level may for example reflect an estimate of the probability that that cause is indeed the true cause.

Preferably, the database of bus signals with corresponding diagnoses associated therewith is integrated with the computer system 4. However, in principle, the database can be implemented as a separate device that is communicatively coupled or loaded to the computer system 4.

Figure 2A:
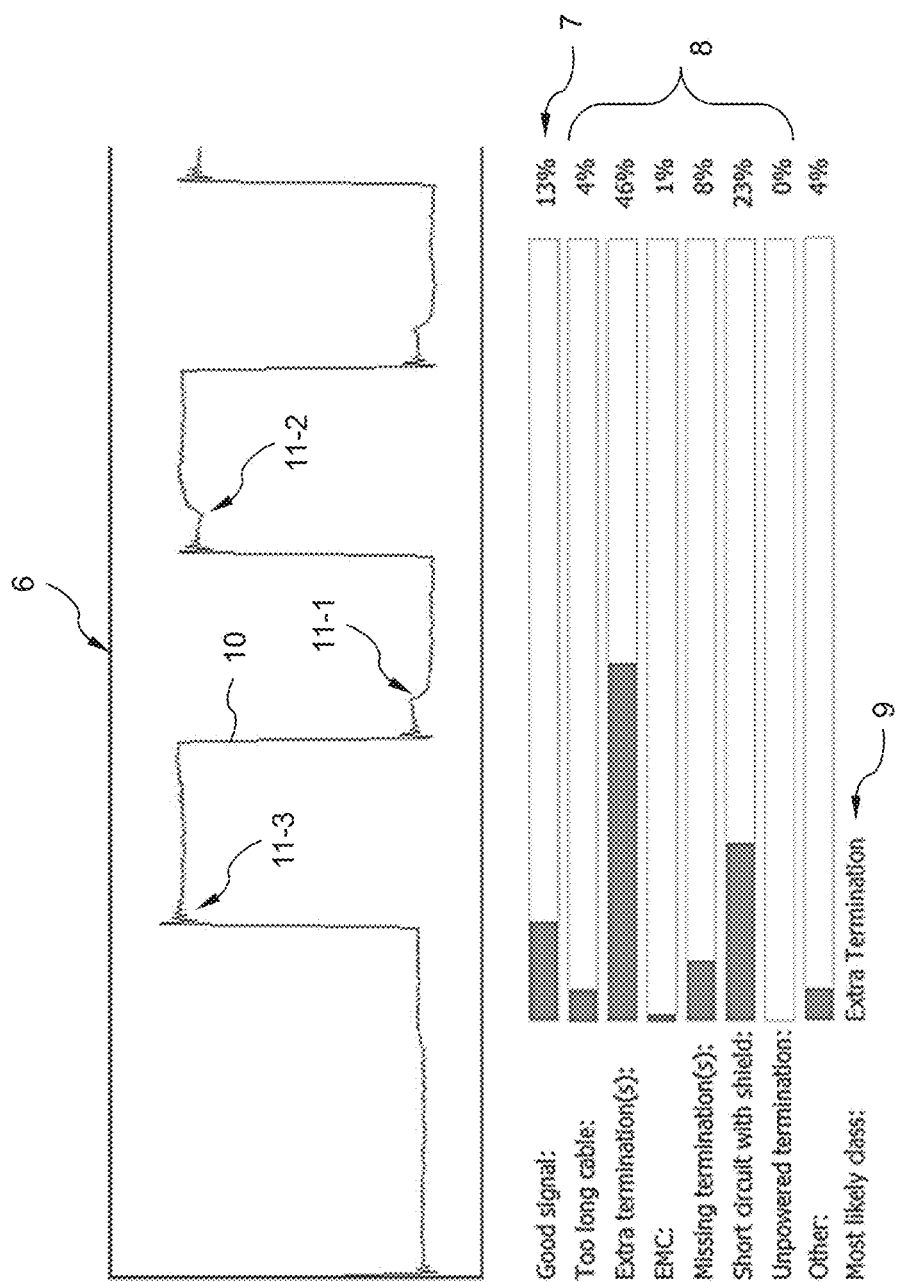
FIGS. 2A and 2B shows a schematic view of a first and a second diagnosis file generated by the diagnosing system of FIG. 1.

FIG. 2A shows a schematic view of a first diagnosis file generated by the diagnosing system 1. The diagnosis file 6 shows an inset with the measured bus signal 10 on which the diagnosis is based. The bus signal 10 shown in FIG. 2A exhibits clear deviations 11-1, 11-2 and 11-3 from a perfect square wave. The diagnosis file generated according to the invention reports that the probability 7 that this corresponds to a good signal is 13%. Also individual probabilities are assigned to a group of causes 8 causing a failure signal. A too long cable is assigned the probability 4%, extra termination(s) 46%, EMC 1%, missing termination(s) 8%, short circuit with shield 23%, unpowered termination 0%, and other 4%. Further, the diagnosis file denotes the most likely class, in FIG. 2A corresponding to an extra termination.

Figure 2B:
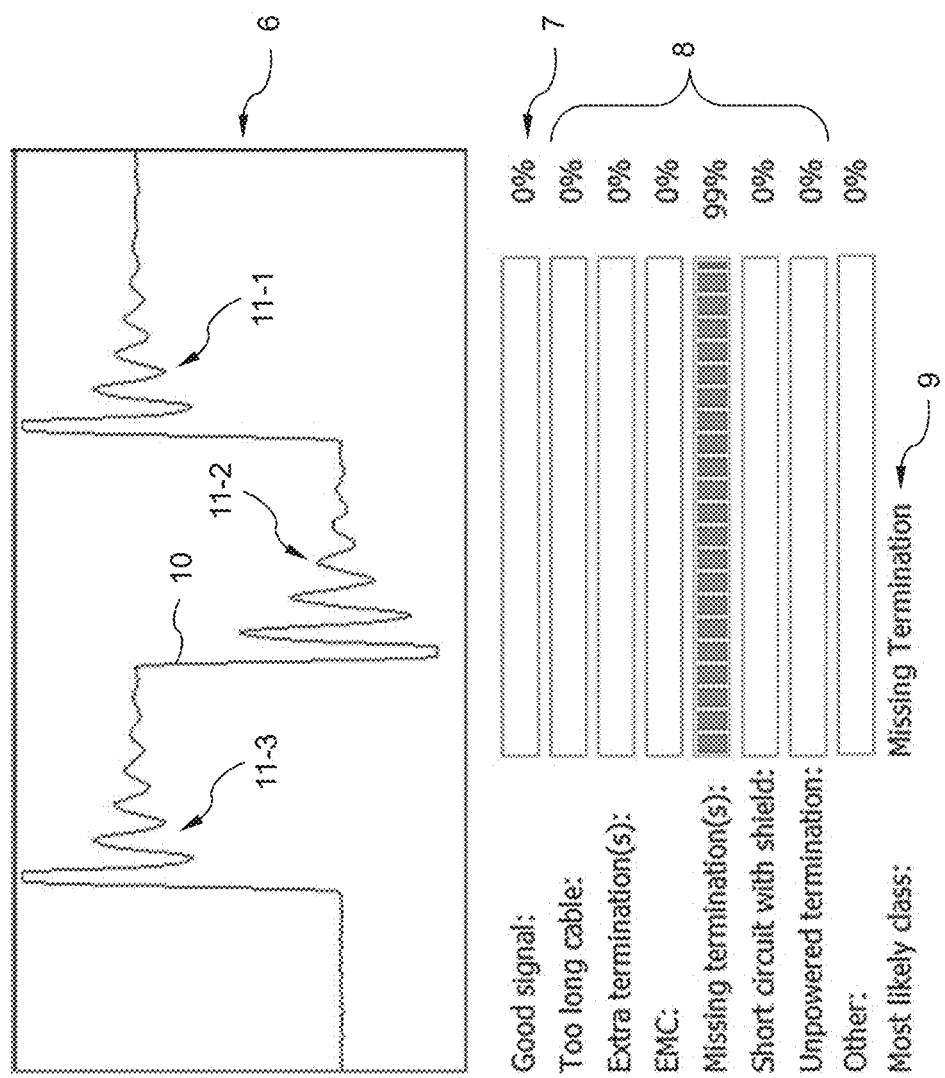

FIG. 2B shows a schematic view of a second diagnosis file generated by the diagnosing system, which is similar to the diagnosis file shown in FIG. 2A. In FIG. 2B the deviations 11-1, 11-2, and 11-3 in the measured signal 10 are characteristic of a missing termination 9, which is assigned a probability of 99%.

In principle, the diagnosis file may include data for visually displaying diagnosis results and/or for further processing the diagnosis results.

The bus signal of the fieldbus type network can be measured using a signal measuring device 3 such as an oscilloscope or a diagnostic circuitry. The signal measuring device 3 can temporarily be connected to the fieldbus type network 2, for the purpose of diagnosing said fieldbus type network 2. Then, the method may involve connecting the signal measuring device 3 to the network 2, measuring the bus signal, and disconnecting the signal measuring device 3 from the network 2.

Further, the measured signal can be converted into a wave format, e.g. a normalized wave format. Then, the bus signal provided to the computer system has a wave format, such that the measured signal is not time based, voltage based.

Figure 3:
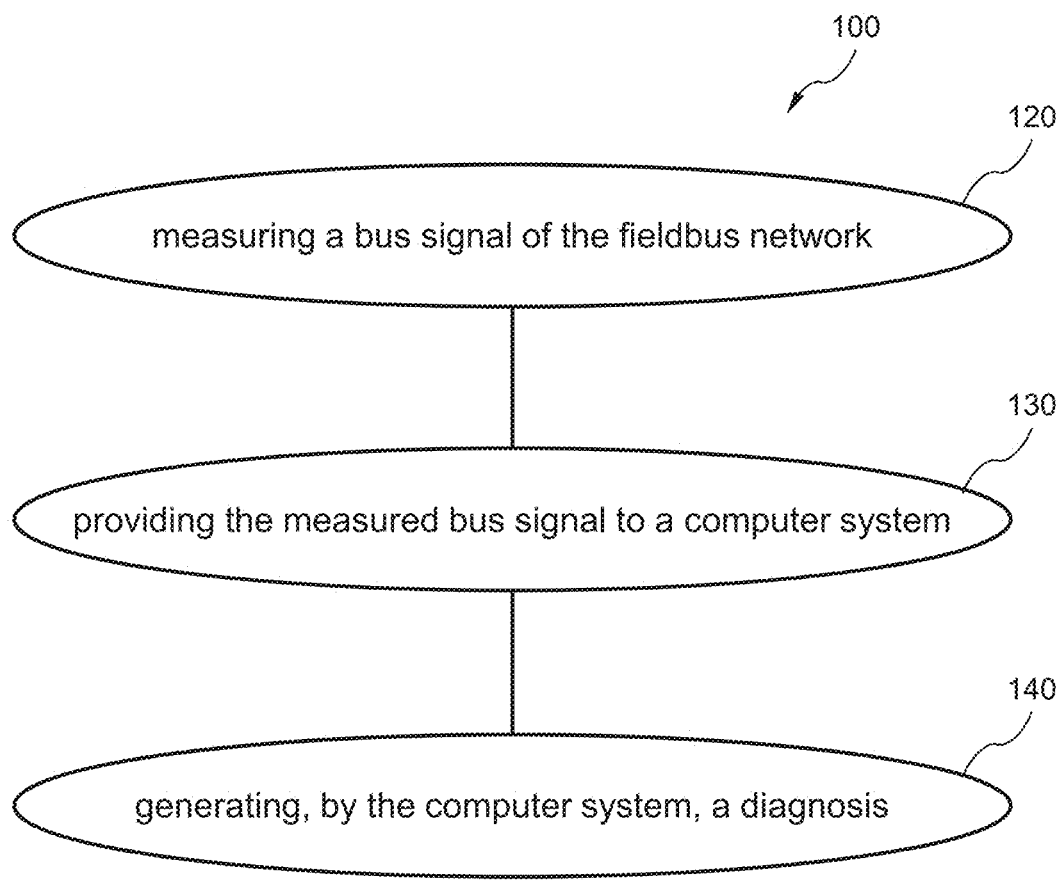
FIG. 3 shows a flow chart of an embodiment of a method according to the invention.

FIG. 3 shows a flow chart of an embodiment of a method 100 according to the invention. The method 100 is used for diagnosing a fieldbus type network 1. The method comprises a step 120 of measuring, using a signal measuring device such as an oscilloscope, a bus signal of the fieldbus type network 1, a step 130 of providing the measured bus signal to a computer system, and a step 140 of generating, by the computer system, a diagnosis. The step 140 of generating a diagnosis includes a step of comparing, by the computer system, the measured bus signal with signals in a database of bus signals and corresponding diagnoses; and/or feeding, by the computer system, the measured bus signal to a trained statistical model trained to diagnose the fieldbus type network, and a step of outputting the diagnosis based on the output of the comparison or the output of the statistical model.

The method for diagnosing a fieldbus network can be performed using dedicated hardware structures, such as FPGA and/or ASIC components.

Otherwise, the method can also at least partially be performed using a computer program product comprising instructions for causing a processor of a computer system 4 or a control unit to perform the above described steps of the method 100 according to the invention, or at least the step 140 of generating a diagnosis. All steps can in principle be performed on a single processor. However, it is noted that at least one step can be performed on a separate processor. A processor can be loaded with a specific software module.

Dedicated software modules can be provided, e.g. from the Internet.

The invention is not restricted to the embodiments described herein. It will be understood that many variants are possible.

It is noted that instead of using an oscilloscope for measuring a bus signal, another signal measuring device can be used, e.g. without a display for displaying the measured bus signal. Further, the signal measuring device may be arranged for pre-processing and/or storing the measured bus signal.

It is further noted that the method may include a step of feeding an input signal to the fieldbus type network, wherein the measured bus signal is a response signal to the fed input signal, e.g. if the fieldbus type network is temporarily silent. Alternatively, the method can be performed without feeding any input signal to the network, e.g. in cases when network devices generate bus signals.

These and other embodiments will be apparent for the person skilled in the art and are considered to fall within the scope of the invention as defined in the following claims. For the purpose of clarity and a concise description features are described herein as part of the same or separate embodiments. However, it will be appreciated that the scope of the invention may include embodiments having combinations of all or some of the features described.

The invention claimed is:

1. A method for diagnosing a fieldbus type network, comprising:
    measuring, using a signal measuring device such as an oscilloscope, a square wave type voltage bus signal of the fieldbus type network;
    providing the measured square wave type voltage bus signal to a computer system communicatively coupled to the signal measuring device via a separate connection;
    generating, by the computer system, a diagnosis by performing the following steps:
        comparing, by the computer system, the measured square wave type voltage bus signal with signals in a database of bus signals and corresponding diagnoses; and/or feeding, by the computer system, the measured square wave type voltage bus signal to a trained statistical model trained to diagnose the fieldbus type network; and
        outputting the diagnosis based on the output of the comparison and/or the output of the trained statistical model.

2. A method according to claim 1, wherein the trained statistical model comprises a neural network.

3. A method according to claim 1, further comprising a step of feeding an input signal to the fieldbus type network, wherein the measured square wave type voltage bus signal is a response signal responding to the fed input signal.

4. A method according to claim 1, further comprising verifying that
    the diagnosis is correct; and
    if the diagnosis is correct, adding the diagnosis and measured square wave type voltage bus signal to the database of earlier measured square wave type voltage bus signals and corresponding diagnoses; and/or updating the trained statistical model using the diagnosis and measured square wave type voltage bus signal.

5. A method according to claim 1, further comprising:
    generating, by the computer system, based on the diagnosis, a diagnosis file, wherein the diagnosis file characterizes whether the signal of the fieldbus type network is affected by a disturbance of the fieldbus type network; and
    the diagnosis file further comprises a most likely cause of the disturbance, if the signal of the fieldbus type network is affected by the disturbance of the fieldbus type network.

6. A method according to claim 5, wherein the diagnosis file further comprises a confidence level for each member of a group of possible causes, that may have caused the disturbance of the fieldbus type network, wherein the group of possible causes preferably includes: a too long cable, an extra termination, electromagnetic compatibility (EMC), a missing termination, a short circuit with a shield, an unpowered termination and/or another cause.

7. A method according to claim 1, wherein the most likely cause of the disturbance is one of the following: a too long cable, an extra termination, electromagnetic compatibility (EMC), a missing termination, a short circuit with a shield, and/or an unpowered termination or another cause.

8. A method according to claim 1, wherein the fieldbus type network is an RS-485 type network or another field bus type network having communication signals and power signals.

9. A method according to claim 1, wherein the measured bus signal provided to the computer system has a wave format.

10. A method according to claim 1, further comprising a step of connecting the signal measuring device to the fieldbus type network, prior to the step of measuring the bus signal, the method further comprising a step of disconnecting the signal measuring device from the fieldbus type network.

11. A method according to claim 1, wherein the output diagnosis includes identification of a fault.

12. A diagnosing system, comprising signal measuring device such as an oscilloscope, and a computer system communicatively coupled to the signal measuring device via a separate connection,
wherein the signal measuring device is arranged for:
measuring a square wave type voltage bus signal of a fieldbus type network; and
sending the measured square wave type voltage bus signal to the computer system;
wherein the computer system is arranged for:
receiving the measured square wave type voltage bus signal from the signal measuring device; and
generating a diagnosis by performing the following steps:
comparing the measured square wave type voltage bus signal with signals in a database of bus signals and corresponding diagnoses, and/or feeding the measured square wave type voltage bus signal to a trained statistical model trained to diagnose the fieldbus type network; and
outputting the diagnosis based on the output of the comparison and/or the output of the trained statistical model.

13. A diagnosing system according to claim 12, wherein the computer system includes a database of bus signals and corresponding diagnoses.

14. A diagnosing system according to claim 12, wherein the computer system is a server at a remote location having Internet connectivity, or wherein the computer system is a handheld electronic device.

15. A non-transitory computer program product for diagnosing a fieldbus type network, the non-transitory computer program product comprising computer readable code for causing a processor to perform the steps of:
receiving a measured square wave type voltage bus signal that has been measured on a fieldbus type network by a signal measuring device; and
generating a diagnosis by performing the following steps:
comparing the measured square wave type voltage bus signal with signals in a database of bus signals and corresponding diagnoses, and/or feeding the measured square wave type voltage bus signal to a trained statistical model trained to diagnose the fieldbus type network; and
outputting the diagnosis based on the output of the comparison or the output of the trained statistical model.

* * * * *